(12) United States Patent
Chien et al.

(10) Patent No.: US 9,230,918 B1
(45) Date of Patent: Jan. 5, 2016

(54) SEMICONDUCTOR PACKAGE STRUCTURE, ALIGNMENT STRUCTURE, AND ALIGNMENT METHOD

(71) Applicant: TAIWAN SEMICONDUCTOR MANUFACTURING CO., LTD., Hsinchu (TW)

(72) Inventors: Ting-Ying Chien, Hsinchu (TW); I-Shi Wang, New Taipei (TW); Jen-Hao Liu, Zhunan Township (TW); Ren-Dou Lee, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/322,495

(22) Filed: Jul. 2, 2014

(51) Int. Cl.
*H01L 23/544* (2006.01)
*H01L 23/00* (2006.01)

(52) U.S. Cl.
CPC .............. *H01L 23/544* (2013.01); *H01L 24/32* (2013.01); *H01L 24/83* (2013.01); *H01L 2223/54426* (2013.01); *H01L 2224/32145* (2013.01); *H01L 2224/83139* (2013.01)

(58) Field of Classification Search
CPC ...... G02B 6/432; G02B 6/4232; H01L 25/50; H01L 29/0657; H01L 2224/16; H01L 225/06513; H01L 225/06593; H01L 2924/01057; H01L 2924/01078; H01L 2924/01079; H05K 3/3436
See application file for complete search history.

(56) References Cited

U.S. PATENT DOCUMENTS 6,643,434 B2 * 11/2003 Cayrefourcq et al. .......... 385/52
2008/0008628 A1 * 1/2008 Park et al. ..................... 422/130

* cited by examiner

*Primary Examiner* — Victor A Mandala
*Assistant Examiner* — Quovaunda V Jefferson
(74) *Attorney, Agent, or Firm* — Maschoff Brennan

(57) ABSTRACT

A semiconductor package structure includes a first wafer and a second wafer. The first wafer has a concave portion. The concave portion has a bottom surface and at least one sidewall adjacent to the bottom surface. An obtuse angle is formed between the bottom surface and the sidewall. The second wafer is disposed on the first wafer and has a protruding portion. When the protruding portion enters an opening of the concave portion, the protruding portion slides along the sidewall to the bottom surface, such that the protruding portion is coupled to the concave portion.

20 Claims, 9 Drawing Sheets

A concave portion of a first wafer and a protruding portion of a second wafer are substantially aligned. — S1

The second wafer is moved to the first wafer, such that a side wall of the concave portion is abutted against the protruding portion. — S2

The protruding portion of the second wafer slides along the side wall to a bottom surface of the concave portion, such that the protruding ortion is located on the bottom surface. — S3

Fig. 3

SEMICONDUCTOR PACKAGE STRUCTURE, ALIGNMENT STRUCTURE, AND ALIGNMENT METHOD

BACKGROUND

Eutectic and fusion bonding has been used for MEMS (micro electro mechanical systems) production procedure as a wafer level package process. The eutectic and fusion bonding describes a wafer bonding technique with an intermediate metal layer that may form a eutectic system. The eutectic metals may be alloys that transform directly from solid to liquid state or vice versa from liquid to solid state at a specific temperature without passing a two-phase equilibrium. Moreover, the eutectic temperature is lower than the melting temperature of the two or more pure elements, so that it is convenient to reduce the process temperature of a bonding process between two elements.

For example, when there is a need to bond a wafer to another wafer, the eutectic and fusion bonding process may be used. In general, the bonding process has two main functions: one function is to package the two wafers in wafer level, and the other function is to maintain the pressure of a device of the wafer. Some semiconductor products need precisely optical alignment to make perfect bonding. If the alignment system of a bonding tool used in the bonding process is abnormal, the wafers may be shifted to bond, and thereby leading device vacuum leakage. Since the eutectic bond alignment precision and the process stability are difficultly improved, the yield rate of the products is also difficultly improved.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3 is a flow chart of an alignment method according to some embodiments of the present disclosure;

DETAILED DESCRIPTION

Figure 1:
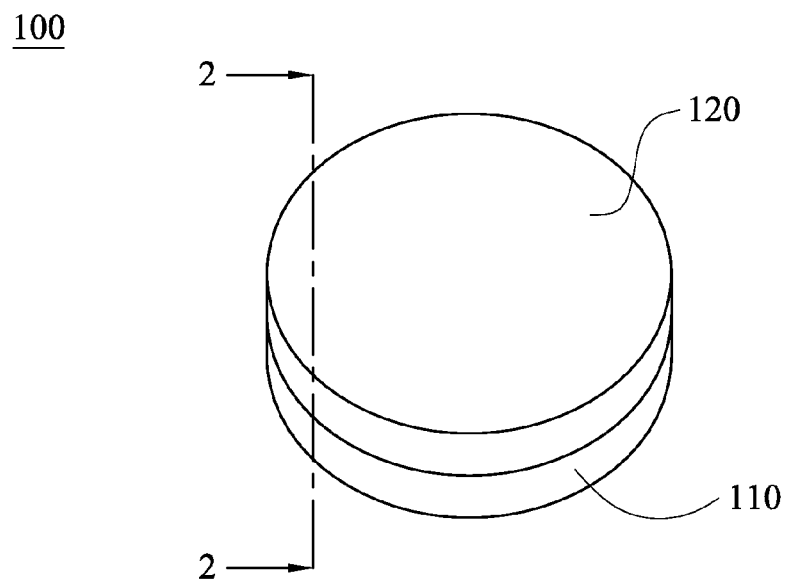
FIG. 1 is a perspective view of a semiconductor package structure according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising", or "includes" and/or "including" or "has" and/or "having" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Reference will now be made in detail to the present embodiments of the disclosure, examples of which are illustrated in the accompanying drawings. Wherever possible, the same reference numbers are used in the drawings and the description to refer to the same or like parts.

Figure 2:
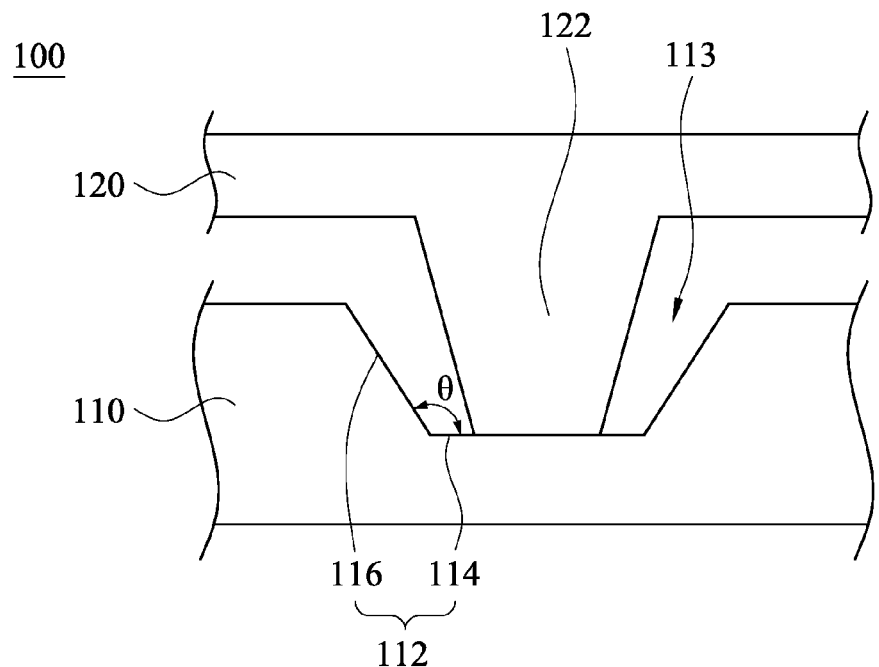
FIG. 2 is a cross-sectional view of a semiconductor package structure taken along line 2-2 shown in FIG. 1.

FIG. 1 is a perspective view of a semiconductor package structure 100 according to some embodiments of the present disclosure. FIG. 2 is a cross-sectional view of the semiconductor package structure 100 taken along line 2-2 shown in FIG. 1. As shown in FIG. 1 and FIG. 2, the semiconductor package structure includes a first wafer 110 and a second wafer 120. The first wafer 110 has a concave portion 112, and the concave portion 112 has a bottom surface 114 and at least one sidewall 116. The sidewall 116 is adjacent to the bottom surface 114, and an obtuse angle θ is formed between the bottom surface 114 and the sidewall 116.

The second wafer 120 is disposed on the first wafer 110 and has a protruding portion 122. In some embodiments, the concave portion 112 of the first wafer 110 is an anti-wedge-shaped structure, and the protruding portion 122 of the second wafer 120 is a wedge-shaped structure. During a bonding process for the first and second wafers 110, 120, the concave portion 112 of the first wafer 110 is used to couple to the protruding portion 122 of the second wafer 120.

After the protruding portion 122 of the second wafer 120 is located on the bottom surface 114 of concave portion 112, a following adhering process may be performed, such as a eutectic process, a fusion process, a soldering process, etc. That is to say, the concave portion 112 of the first wafer 110 and the protruding portion 122 of the second wafer 120 may be regarded as alignment structures of the semiconductor package structure 100.

In some embodiments, each of the first and second wafers 110, 120 may be a thin slice of semiconductor material, such as a silicon crystal, used in the fabrication of integrated circuits and other micro devices. The first and second wafers 110, 120 may serve as the substrates for microelectronic devices built thereon, and may undergo micro fabrication process steps, such as doping implantation, ion implantation, etching, CVD (chemical vapor deposition) of various materials, PVD (physical vapor deposition) of various materials, and photolithographic patterning. The first and second wafers 110, 120 may be overlapped and packaged in wafer level to form the semiconductor package structure 100 shown in FIG. 1.

The protruding portion 122 of the second wafer 120 and the concave portion 112 of the first wafer 110 may be formed by a grinding process, or photolithography processes (i.e., an exposure process, a development process, and an etching process), but the present disclosure is not limited in this regard.

FIG. 3 is a flow chart of an alignment method according to some embodiments of the present disclosure. The alignment method for a bonding process includes the following steps. In step S1, a concave portion of a first wafer and a protruding portion of a second wafer are substantially aligned. Thereafter in step S2, the second wafer is moved to the first wafer, such that a sidewall of the concave portion is abutted against the protruding portion. Finally in step S3, the protruding portion of the second wafer slides along the sidewall to a bottom surface of the concave portion, such that the protruding portion is located on the bottom surface.

In the following description, the aforementioned steps will be described in detail.

Figure 4:
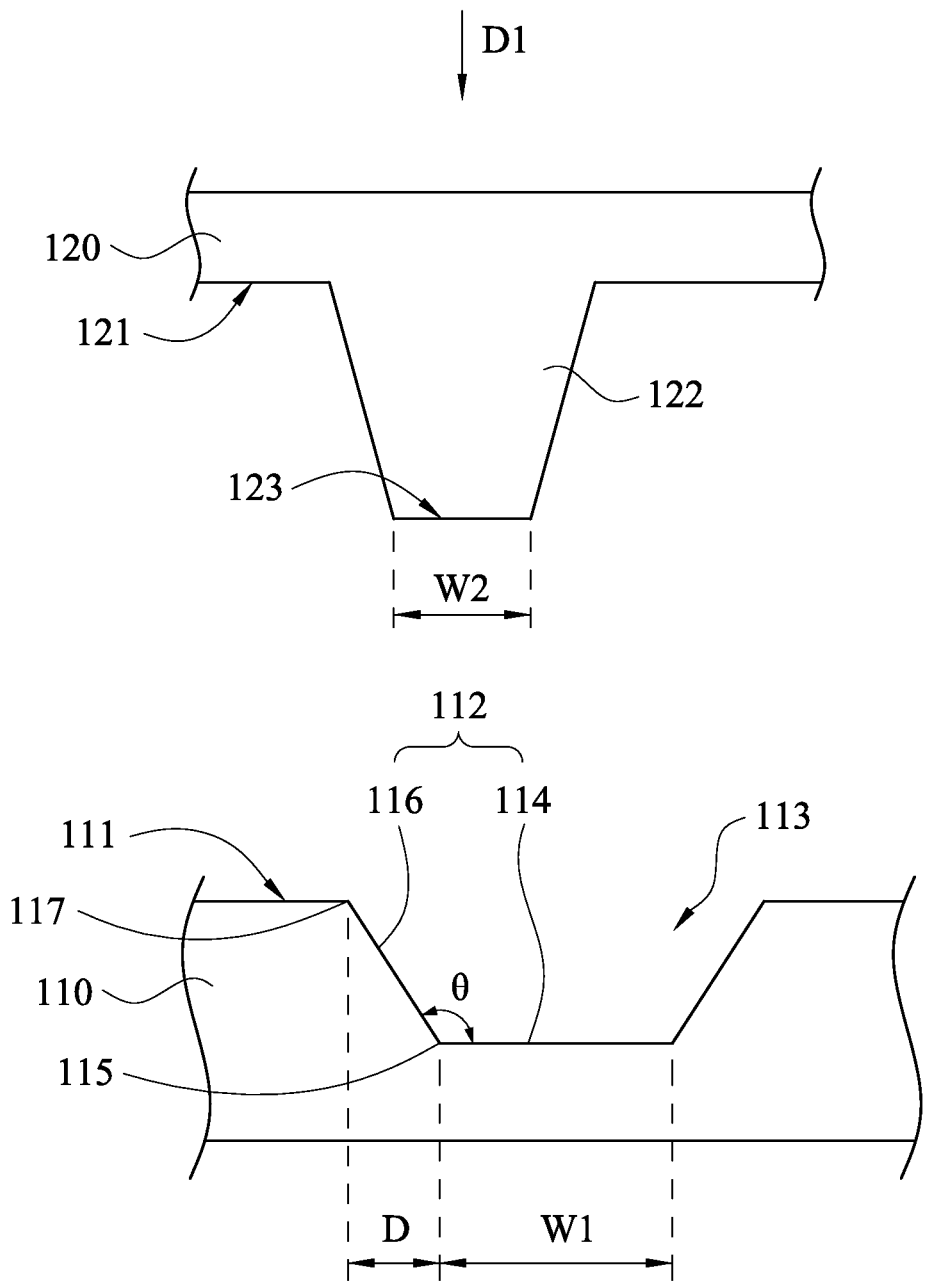
FIG. 4 is a schematic view of a second wafer shown in FIG. 1 before assembled to a first wafer.
Figure 5:
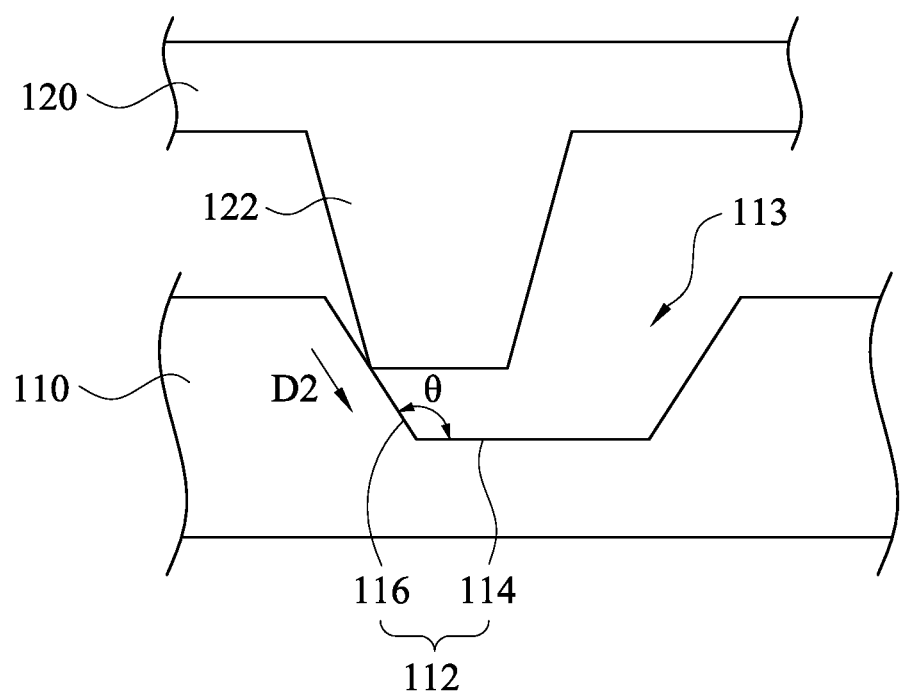
FIG. 5 is a schematic view of a protruding portion of a second wafer shown in FIG. 4 when entering an opening of a concave portion.

FIG. 4 is a schematic view of the second wafer 120 shown in FIG. 1 before assembled to the first wafer 110. FIG. 5 is a schematic view of the protruding portion 122 of the second wafer 120 shown in FIG. 4 when entering the opening 113 of the concave portion 112. As shown in FIG. 4 and FIG. 5, in some embodiments, an alignment tool (e.g., an optical equipment) is used to align the first and second wafers 110, 120. However, if the alignment accuracy of the alignment tool is not good enough or the alignment tool is in an abnormal state, the concave portion 112 of the first wafer 110 and the protruding portion 122 of the second wafer 120 may not be aligned precisely, and may be only substantially aligned. "Substantially aligned" means that the center position of the protruding portion 122 may not be definitely aligned with the center position of the bottom surface 114 of the concave portion 112, such that a shift is formed between the protruding portion 122 and the concave portion 112.

As a result, when the second wafer 120 is moved to the first wafer 110 in a vertical direction D1 toward the concave portion 112, the sidewall 116 of the concave portion 112 may be abutted against the protruding portion 122 of the second wafer 120, as shown in FIG. 5.

Since the obtuse angle θ is formed between the bottom surface 114 and the sidewall 116, the sidewall 116 is an oblique plane relative to the bottom surface 114. Therefore, after the protruding portion 122 enters the opening 113 of the concave portion 112 to contact the sidewall 116 of the concave portion 112, the protruding portion 122 of the second wafer 120 may slide along the sidewall 116 to the bottom surface 114 in a direction D2, such that the protruding portion 122 of the second wafer 120 may be coupled to the concave portion 112 of the first wafer 110, as shown in FIG. 2.

The protruding portion 122 of the second wafer 120 may slide along the sidewall 116 of the concave portion 112 depending on gravity and the design of the obtuse angle θ formed between the bottom surface 114 and the sidewall 116, such that the protruding portion 122 may be located on the bottom surface 114 of the concave portion 112 even if the previous alignment between the first and second wafers 110, 120 is shifted or abnormal.

Moreover, if the protruding portion 122 of the second wafer 120 is precisely aligned with the concave portion 112 of the second first wafer 110 by the alignment tool, the protruding portion 122 of the second wafer 120 may be moved in the vertical direction D1 to directly locate on the bottom surface 114 of the concave portion 112. In this case, the protruding portion 122 does not need to slide along the sidewall 116 of the concave portion 112.

The semiconductor package structure 100 (see FIG. 2) of the present disclosure reaches the self-alignment purpose for the concave portion 112 of the second first wafer 110 and the protruding portion 122 of the second wafer 120, thereby improving the yield rate of the bonding process for the first and second wafers 110, 120, and reducing the possibility of vacuum leakage of devices disposed on the first and second wafers 110, 120.

In addition, the first wafer 110 has a first surface 111 facing the second wafer 120, and the concave portion 112 is formed in the first surface 111 of the first wafer 110. The second wafer 120 has a second surface 121 facing the first wafer 110, and the protruding portion 122 is formed on the second surface 121 of the second wafer 120. A first connecting edge 115 is formed between the bottom surface 114 and the sidewall 116 of the first wafer 110, and a second connecting edge 117 is formed between the sidewall 116 and the first surface 111 of the first wafer 110.

In some embodiments, a horizontal distance D between the first and second connecting edges 115, 117 may be in a range from 8 to 12 μm. For example, the horizontal distance D is 10 μm. The horizontal distance D may increase the probability of the alignment between the first and second wafers 110, 120.

As shown in FIG. 2 and FIG. 4, the protruding portion 122 of the second wafer 120 has a top surface 123. When the protruding portion 122 is located on the bottom surface 114 of the concave portion 112, the top surface 123 of the protruding portion 122 is abutted against the bottom surface 114 of the first wafer 110. In some embodiments, the width W1 of the bottom surface 114 of the concave portion 112 may be greater than the width W2 of the top surface 123 of the protruding portion 122 in a range from 5 to 7 μm. For example, the difference between the width W1 and the width W2 is 6 μm.

Figure 6:
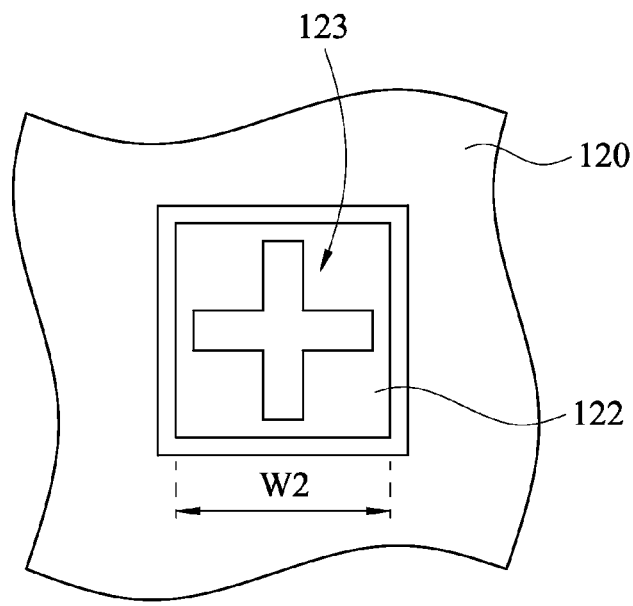
FIG. 6 is a bottom view of a protruding portion of a second wafer shown in FIG. 4.
Figure 7:
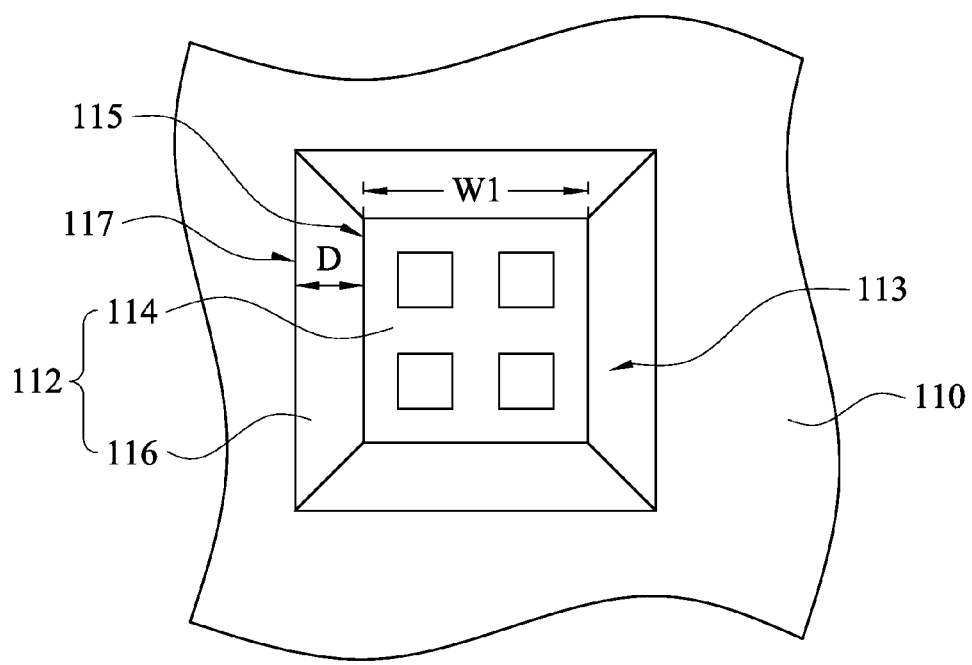
FIG. 7 is a top view of a concave portion of a first wafer shown in FIG. 4.

FIG. 6 is a bottom view of the protruding portion 122 of the second wafer 120 shown in FIG. 4. FIG. 7 is a top view of the concave portion 113 of the first wafer 110 shown in FIG. 4. As shown in FIG. 6 and FIG. 7, the sidewall 116 surrounds the bottom surface 114, and the concave portion 112 and the protruding portion 122 have two corresponding cross-shaped marks. When the second wafer 120 is bonded to the first wafer 110, the protruding portion 122 of the second wafer 120 needs to locate on the bottom surface 114 of the first wafer 110. In some embodiments, the difference between the width W1 of the bottom surface 114 and the width W2 of the top surface 123 may be in a range from 5 to 7 μm, and the horizontal distance D between the first and second connecting edges 115, 117 may be in a range from 9 to 11 μm.

Since the protruding portion 122 may slide along the side surface 116 to the bottom surface 114 of the concave portion 112, the present disclosure does not easily lead wafer shift due to the alignment equipment abnormal. As a result, the alignment accuracy tolerance of the bonding process for the first and second wafers 110, 120 may be improved in a range from 2 to 4 μm.

It is to be noted that the utility and the connection relationships of the structures described above will not be repeated in the following description, and only aspects related to other elements of the semiconductor package structure will be described.

Figure 8:
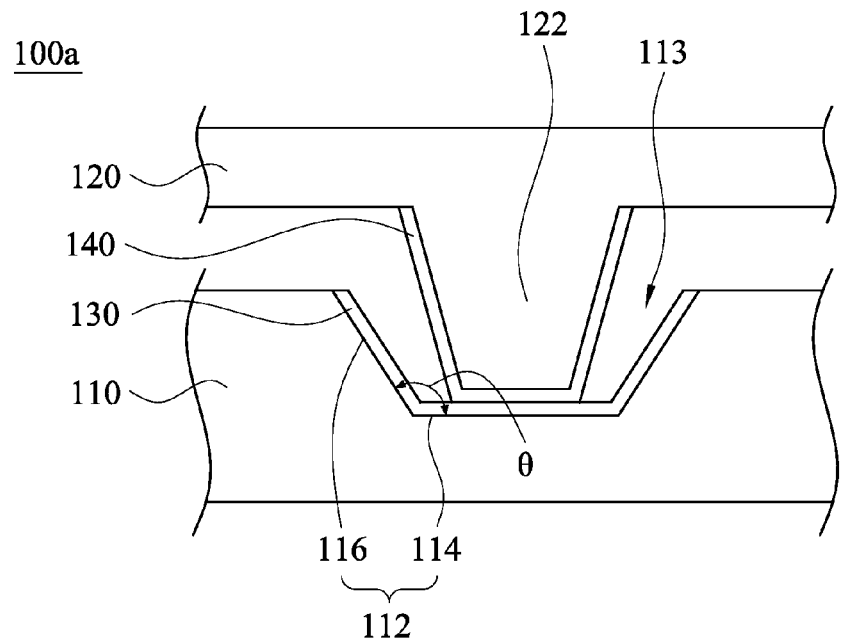
FIG. 8 is a cross-sectional view of a semiconductor package structure according to some embodiments of the present disclosure, in which the cross-sectional position is the same as in FIG. 2.

FIG. 8 is a cross-sectional view of a semiconductor package structure 100a according to some embodiments of the present disclosure, in which the cross-sectional position is the same as in FIG. 2. As shown in FIG. 8, the semiconductor package structure 100a includes the first and second wafers 110, 120. The first wafer 110 has the concave portion 112 having the bottom surface 114 and the sidewall 116. The sidewall 116 is adjacent to the bottom surface 114, and the obtuse angle θ is formed between the bottom surface 114 and the sidewall 116.

The difference between this embodiment and the embodiment shown in FIG. 2 is that the semiconductor package structure 100a further includes a first hydrophobic film 130 formed on the sidewall 116 and the bottom surface 114, and includes a second hydrophobic film 140 formed on the protruding portion 122.

Figure 9:
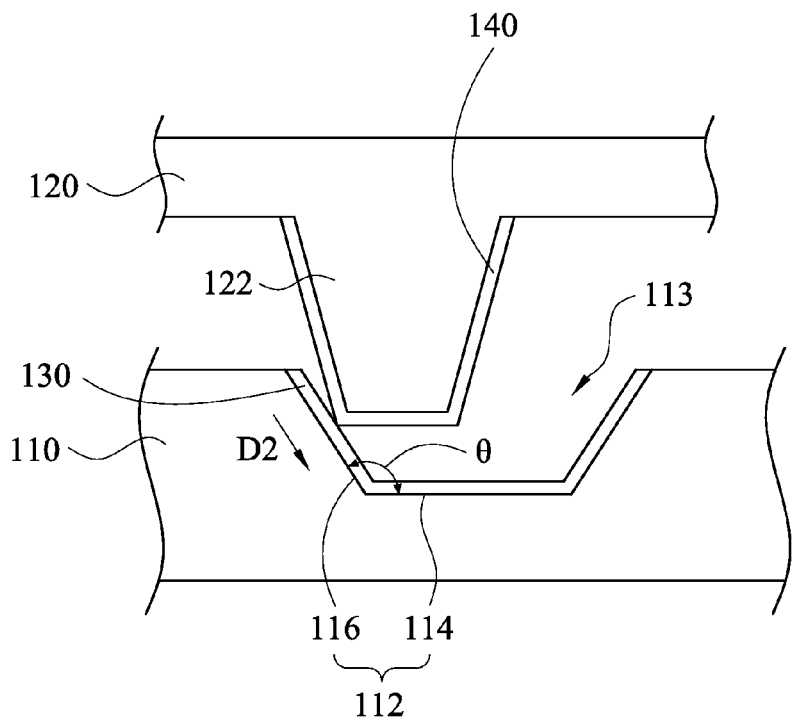
FIG. 9 is a schematic view of a protruding portion of the second wafer shown in FIG. 8 when entering an opening of a concave portion.

FIG. 9 is a schematic view of the protruding portion 122 of the second wafer 120 shown in FIG. 8 when entering the opening 113 of the concave portion 112. As shown in FIG. 8 and FIG. 9, the obtuse angle θ is formed between the bottom surface 114 and the sidewall 116. Therefore, after the protruding portion 122 of the second wafer 120 enters the opening 113 of the concave portion 112 of the first wafer 110 to contact the sidewall 116 of the concave portion 112, the protruding portion 122 of the second wafer 120 may slide along the sidewall 116 to the bottom surface 114 in the direction D2.

Since the first hydrophobic film 130 is located on the sidewall 116 and the bottom surface 114 of the concave portion 112 and the second hydrophobic film 140 is located on the protruding portion 122 of the second wafer 120, the protruding portion 122 is prevented form being adhered to the sidewall 116 and the bottom surface 114 of the concave portion 112.

As a result, the protruding portion 122 of the second wafer 120 may smoothly slide along the sidewall 116 of the concave portion 112 of the first safer 110. The first hydrophobic film 130 is located on the sidewall 116 and the bottom surface 114 of the concave portion 112.

Figure 10:
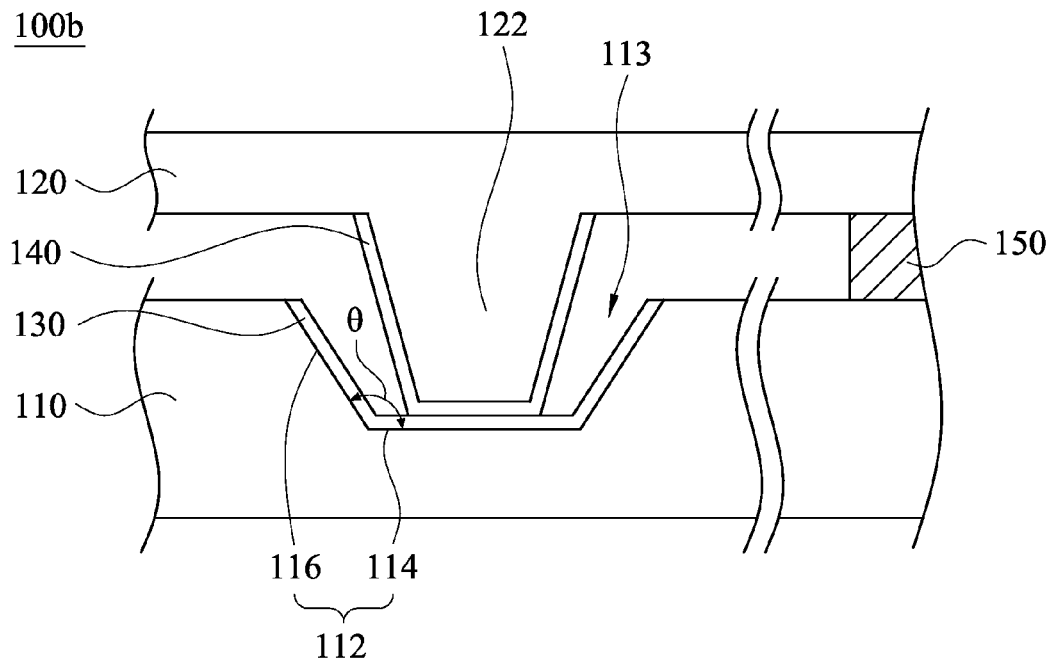
FIG. 10 is a cross-sectional view of a semiconductor package structure according to some embodiments of the present disclosure, in which the cross-sectional position is the same as in FIG. 2.

FIG. 10 is a cross-sectional view of a semiconductor package structure 100b according to some embodiments of the present disclosure, in which the cross-sectional position is the same as in FIG. 2. The semiconductor package structure 100b includes the first and second wafers 110, 120. The first wafer 110 has the concave portion 112 having the bottom surface 114 and the sidewall 116. The sidewall 116 is adjacent to the bottom surface 114, and the obtuse angle θ is formed between the bottom surface 114 and the sidewall 116.

The difference between this embodiment and the embodiment shown in FIG. 8 is that the semiconductor package structure 100b further includes an adhesive layer 150. The adhesive layer 150 is between the first and second wafers 110, 120, such that the second wafer 120 is adhered to the first wafer 110, and the semiconductor package structure 100b is sealed by the adhesive layer 150. In some embodiments, the adhesive layer 150 may be applied after the bonding process of the first and second wafers 110, 120. The adhesive layer 150 may be made of a material including metal, alloy, solder, or combinations thereof.

Figure 11:
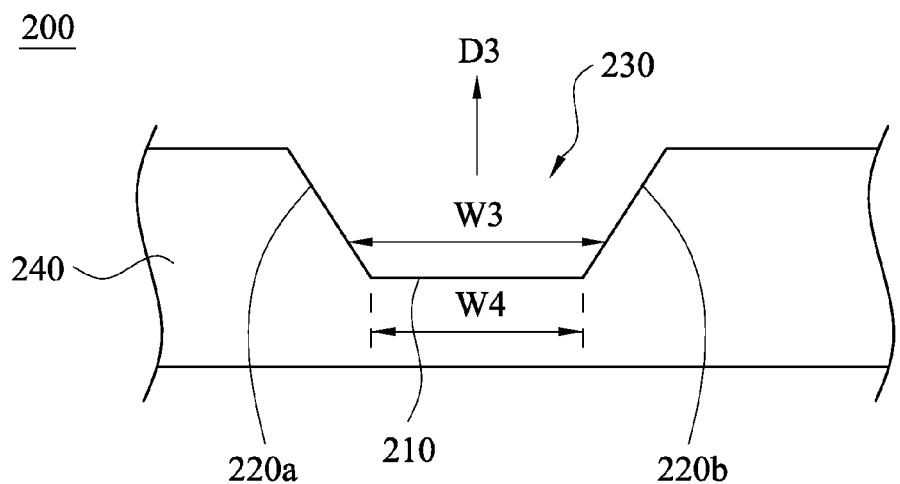
FIG. 11 is a cross-sectional view of an alignment structure according to some embodiments of the present disclosure, in which the cross-sectional position is the same as in FIG. 2 without a second wafer.

FIG. 11 is a cross-sectional view of an alignment structure 200 according to some embodiments of the present disclosure, in which the cross-sectional position is the same as in FIG. 2 without the second wafer 120. As show in FIG. 11, the alignment structure 200 includes a bottom surface 210, two sidewalls 220a, 220b. The sidewalls 220a, 220b are respectively adjacent to two end edges of the bottom surface 210, and sidewall 220a is opposite to the sidewall 220b. A groove 230 is formed among the bottom surface 210 and the sidewalls 220a, 220b. The width W3 of the groove 230 is gradually increased in an outward direction D3 that is away from the bottom surface 210.

Since the width W3 of the groove 230 is gradually increased in the outward direction D3 that is away from the bottom surface 210, the sidewalls 220a, 220b are oblique planes relative to the bottom surface 210.

Figure 12:
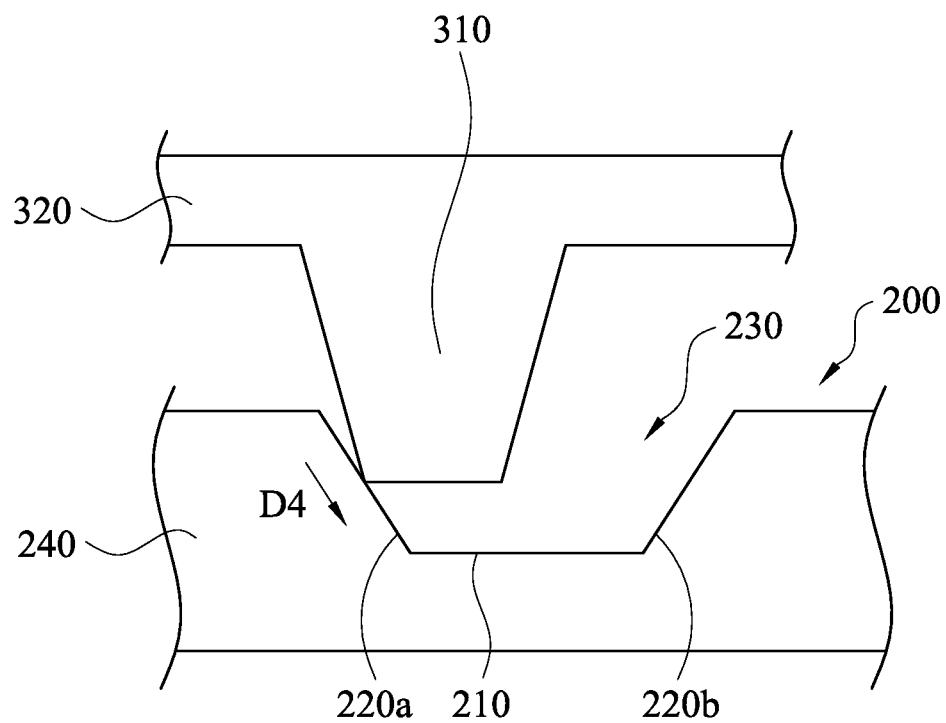
FIG. 12 is a schematic view of a protruding portion when entering a groove of an alignment structure shown in FIG. 11.
Figure 13:
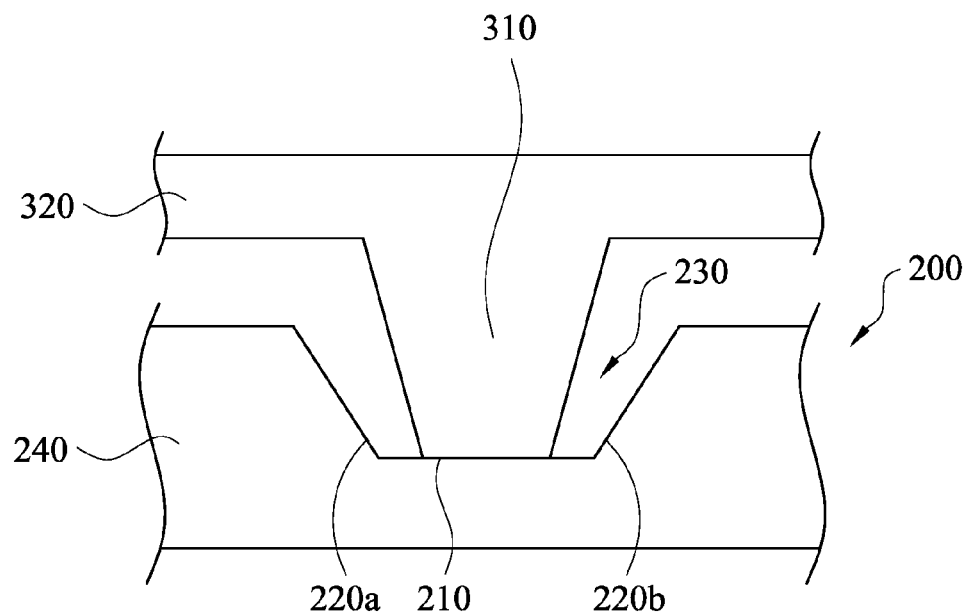
FIG. 13 is a schematic view of the alignment structure shown in FIG. 12 when a protruding portion slides to a bottom surface of an alignment structure.

FIG. 12 is a schematic view of a protruding portion 310 when entering the groove 230 of the alignment structure 200 shown in FIG. 11. FIG. 13 is a schematic view of the alignment structure 200 shown in FIG. 12 when the protruding portion 310 slides to the bottom surface 210 of the alignment structure 200. As shown in FIG. 12 and FIG. 13, the alignment structure 200 may be used to assemble to the protruding portion 310. When the protruding portion 310 enters the groove 230, the protruding portion 310 contacts the sidewall 220a or the sidewall 220b of the alignment structure 200. Thereafter, the protruding portion 310 may slide along the sidewall 220a (e.g., in a direction D4) or the sidewall 220b to the bottom surface 210 due to the design of the groove 230.

Moreover, when the protruding portion 310 slides to the bottom surface 210, the protruding portion 310 is coupled to the groove 230, and the sidewalls 220a, 220b surround the protruding portion 310, as shown in FIG. 13.

In some embodiments, the bottom surface 210 and the sidewalls 220a, 220b may be formed on a first wafer 240, and the protruding portion 310 may be formed on a second wafer 320. As a result, when the protruding portion 310 of the second wafer 320 slides to the bottom surface 210 of the first wafer 240, the second wafer 320 may overlap the first wafer 240.

The protruding portion 310 of the second wafer 320 may slide along the sidewall 220a or the sidewall 220b of the alignment structure 200 depending on gravity and the design of the width W3 (see FIG. 11) of the groove 230, such that the protruding portion 310 may be located on the bottom surface 210 of the alignment structure 200 even if the previous alignment between the first and second wafers 240, 320 is shifted or abnormal.

Moreover, if the protruding portion 310 of the second wafer 320 is precisely aligned with the center of the groove 230 of the alignment structure 200 by the alignment tool, the protruding portion 310 of the second wafer 320 may be moved in a downward direction to directly locate on the bottom surface 210 of the alignment structure 200 without sliding along the sidewalls 220a, 220b of the alignment structure 200.

Figure 14:
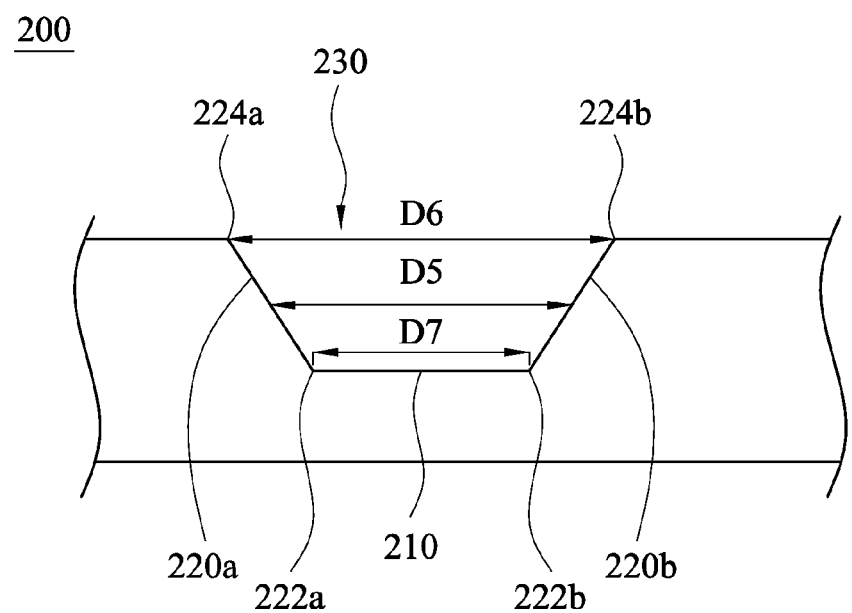
FIG. 14 is a schematic view of a groove of an alignment structure shown in FIG. 11.

FIG. 14 is a schematic view of the groove 230 of the alignment structure 200 shown in FIG. 11. As shown in FIG. 11 and FIG. 14, the width W3 of the groove 230 is gradually increased in the direction D3. That is to say, a distance D5 between the two sidewalls 220a, 220b defines the width W3 of the groove 230 of the alignment structure 200. In some embodiments, the sidewall 220a of the alignment structure 200 has a first end edge 222a and a second end edge 224a. The second end edge 224a is opposite to the first end edge 222a. The sidewall 220b of the alignment structure 200 has a first end edge 222b and a second end edge 224b. The second end edge 224b is opposite to the first end edge 222b. Moreover, the two first end edges 222a, 222b are connected to the bottom surface 210.

In addition, a distance D6 between the two second end edges 224a, 224b is the maximum width W3 of the groove 230, and a distance D7 between the two first end edges 222a, 222b is the minimum width W3 of the groove 230. Furthermore, the minimum width W3 of the groove 230 is the same as the width W4 of the bottom surface 210.

As shown in FIG. 2 and FIG. 13, each of the concave portion 112, the protruding portions 122, 310, and the groove 230 of the present disclosure may be regarded as alignment structures for the wafer bonding process. Moreover, the first hydrophobic film 130 and the second hydrophobic film 140 shown in FIG. 8 may also be used to the bottom surface 210 and the sidewalls 220a, 220b of the alignment structure 200, such that the protruding portion 310 may smoothly slide along the sidewall 220a or the sidewall 220b.

The semiconductor package structure, the alignment structure, and the alignment method of the present disclosure have the following advantages. The alignment accuracy may be enhanced by the design of the aforesaid alignment structure, thereby leading perfect bonding reaction and seal. Moreover, since the appearance of the wafer may be easily changed to form the alignment structure, the manufacturing cost for the alignment structure of the wafer is not increased. In addition, even though the alignment position is not precise, but this new design still leads a wafer bonding in the right position of another wafer due to the aforesaid directional side surface adjacent to the bottom surface.

According to some embodiments, a semiconductor package structure is provided. The semiconductor package structure includes a first wafer and a second wafer. The first wafer has a concave portion. The concave portion has a bottom surface and at least one sidewall adjacent to the bottom surface. An obtuse angle is formed between the bottom surface and the sidewall. The second wafer is disposed on the first wafer and has a protruding portion. When the protruding portion enters an opening of the concave portion, the protruding portion slides along the sidewall to the bottom surface, such that the protruding portion is coupled to the concave portion.

According to some embodiments, an alignment structure for being assembled to a protruding portion. The alignment structure includes a bottom surface and at least one sidewall. The sidewall is adjacent to the bottom surface. A groove is formed among the bottom surface and the sidewall. The width of the groove is gradually increased in an outward direction that is away from the bottom surface. When the protruding portion enters the groove, the protruding portion slides along the sidewall to the bottom surface.

According to some embodiments, an alignment method for bonding process is provided. The alignment method includes the following steps. A concave portion of a first wafer and of a protruding portion of a second wafer are substantially aligned. The second wafer is moved to the first wafer, such that a sidewall of the concave portion is abutted against the protruding portion. The protruding portion of the second wafer slides along the sidewall to a bottom surface of the concave portion, such that the protruding portion is located on the bottom surface.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package structure comprising:
    a first wafer having a concave portion, wherein the concave portion has a first mark, a bottom surface and at least one sidewall adjacent to the bottom surface, and an obtuse angle is formed between the bottom surface and the sidewall; and a second wafer disposed on the first wafer and having a protruding portion, wherein the protruding portion has a second mark; when the protruding portion enters an opening of the concave portion, the protruding portion slides along the sidewall to the bottom surface, such that the protruding portion is coupled to the concave portion, and a position of the first mark corresponds to a position of the second mark.

2. The semiconductor package structure of claim 1, further comprising:
a first hydrophobic film located on the sidewall and the bottom surface of the concave portion.

3. The semiconductor package structure of claim 1, further comprising:
a second hydrophobic film located on the protruding portion of the second wafer.

4. The semiconductor package structure of claim 1, wherein the first wafer has a first surface facing the second wafer, and the concave portion is formed in the first surface of the first wafer.

5. The semiconductor package structure of claim 4, wherein a first connecting edge is formed between the bottom surface and the sidewall, a second connecting edge is formed between the sidewall and the first surface, and a horizontal distance between the first and second connecting edges is in a range from 8 to 12 μm.

6. The semiconductor package structure of claim 1, wherein the second wafer has a second surface facing the first wafer, and the protruding portion is formed on the second surface of the second wafer.

7. The semiconductor package structure of claim 1, wherein the protruding portion has a top surface abutted against the bottom surface of the first wafer, and a width of the bottom surface is greater than a width of the top surface in a range from 5 to 7 μm.

8. The semiconductor package structure of claim 1, further comprising:
an adhesive layer between the first and second wafers.

9. The semiconductor package structure of claim 1, wherein the sidewall surrounds the bottom surface.

10. The semiconductor package structure of claim 1, wherein the concave portion is an anti-wedge-shaped structure and the protruding portion is a wedge-shaped structure.

11. An alignment structure for being assembled to a protruding portion, wherein the alignment structure comprises:
a bottom surface having a first mark; and
at least one sidewall adjacent to the bottom surface, wherein a groove is formed among the bottom surface and the sidewall, a width of the groove is gradually increased in an outward direction that is away from the bottom surface, and the protruding portion has a second mark; when the protruding portion enters the groove, the protruding portion slides along the sidewall to the bottom surface, such that a position of the first mark corresponds to a position of the second mark.

12. The alignment structure of claim 11, wherein the bottom surface and the sidewall are formed on a first wafer, and the protruding portion is formed on a second wafer.

13. The alignment structure of claim 12, wherein when the protruding portion slides to the bottom surface, the second wafer overlaps the first wafer.

14. The alignment structure of claim 12, wherein when the protruding portion slides to the bottom surface, the sidewall surrounds the protruding portion.

15. The alignment structure of claim 11, wherein the number of the sidewalls is two, one of the two sidewalls is opposite to the other sidewall, and a distance between the two sidewalls defines the width of the groove.

16. The alignment structure of claim 15, wherein each of the two sidewalls has a first end edge and a second end edge opposite to the first end edge, the two first end edges are connected to the bottom surface, a distance between the two second end edges is the maximum width of the groove, and a distance between the two first end edges is the minimum width of the groove.

17. The alignment structure of claim 16, wherein the minimum width of the groove is the same as a width of the bottom surface.

18. An alignment method for bonding process, comprising:
substantially aligning a concave portion of a first wafer and a protruding portion of a, wherein the concave portion has a first mark and the protruding portion has a second mark wafer;
moving the second wafer to the first wafer, such that a sidewall of the concave portion is abutted against the protruding portion; and
sliding the protruding portion of the second wafer along the sidewall to a bottom surface of the concave portion, such that the protruding portion is located on the bottom surface and a position of the first mark of the concave portion corresponds to a position of the second mark of the protruding portion.

19. The alignment method of claim 18, further comprising:
adhering the second wafer to the first wafer.

20. The alignment method of claim 18, further comprising:
forming a first hydrophobic film on the sidewall and the bottom surface of the concave portion; and
forming a second hydrophobic film on the protruding portion of the second wafer.

* * * * *